US009646681B1

(12) United States Patent
Jung et al.

(10) Patent No.: US 9,646,681 B1
(45) Date of Patent: May 9, 2017

(54) MEMORY CELL WITH IMPROVED WRITE MARGIN

(71) Applicant: QUALCOMM Incorporated, San Diego, CA (US)

(72) Inventors: Changho Jung, San Diego, CA (US); Keejong Kim, Phoenix, AZ (US); Sei Seung Yoon, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/137,952

(22) Filed: Apr. 25, 2016

(51) Int. Cl.
G11C 11/00 (2006.01)
G11C 11/419 (2006.01)
G11C 11/412 (2006.01)

(52) U.S. Cl.
CPC .......... G11C 11/419 (2013.01); G11C 11/412 (2013.01); G11C 11/4125 (2013.01)

(58) Field of Classification Search
CPC ............................ G11C 11/412; G11C 11/419
USPC ........................................................ 365/156
See application file for complete search history.

(56) References Cited

U.S. PATENT DOCUMENTS

| 3,971,004 | A |   | 7/1976  | Dingwall |               |
|-----------|---|---|---------|----------|---------------|
| 6,011,713 | A | * | 1/2000  | Yamane   | G11C 11/419   |
|           |   |   |         |          | 365/154       |
| 7,492,627 | B2 |  | 2/2009  | Russell et al. |         |
| 7,706,173 | B2 |  | 4/2010  | Ikeda    |               |
| 8,130,579 | B2 | * | 3/2012  | Kumar    | G11C 11/412   |
|           |   |   |         |          | 365/154       |
| 8,330,496 | B2 | * | 12/2012 | Yamaoka  | G11C 11/413   |
|           |   |   |         |          | 326/113       |
| 8,743,645 | B2 |  | 6/2014  | Nii et al. |             |
| 8,817,528 | B2 | * | 8/2014  | Otto     | G11C 11/413   |
|           |   |   |         |          | 365/154       |
| 9,093,125 | B2 |  | 7/2015  | Puckett et al. |         |
| 2007/0177419 | A1 | * | 8/2007 | Sachdev | G11C 11/413  |
|           |   |   |         |          | 365/156       |

* cited by examiner

Primary Examiner — Son Mai
(74) Attorney, Agent, or Firm — Arent Fox LLP

(57) ABSTRACT

A memory and a method for operating a memory are provided. The memory includes a memory cell having a first circuit to store a bit and a second circuit to decouple the stored bit from a power supply and from a return. The method includes storing a bit in a memory cell by a first circuit and decoupling the stored bit from a power supply and a return by a second circuit. Another memory is provided. The memory includes a memory cell having means for storing a bit by a feedback and means for disabling the feedback.

20 Claims, 10 Drawing Sheets

MEMORY CELL WITH IMPROVED WRITE MARGIN

BACKGROUND

Field

The present disclosure relates generally to electronic circuits, and more particularly, to memories with novel memory cells with improved write margin.

Background

Memory is a vital component for wireless communication devices. For example, a memory may be integrated as part of an application processor in a mobile phone. With the ever increasing demands for more processing capability in these wireless communication devices, low power consumption has become a common and critical design requirement. For example, low-voltage memories are desirable in products for the emerging of Internet of Things.

Various techniques are currently employed to reduce power consumption in wireless communication devices. One such technique involves reducing the operating voltage of the memories. However, operating the memories at a low voltage may reduce write margin. That is, the performance of the such low-voltage memories may not be as robust as desired because of write fails. Accordingly, one design challenge is how to address the write margin issue.

SUMMARY

Aspects of a memory are disclosed. In one aspect, the memory includes a memory cell having a first circuit to store a bit and a second circuit to decouple the stored bit from a power supply and from a return.

Aspects for operating a memory are disclosed. In one aspect, the method includes storing a bit in a memory cell by a first circuit and decoupling the stored bit from a power supply and a return by a second circuit.

Further aspects of a memory are disclosed. In one aspect, the memory includes a memory cell having means for storing a bit by a feedback and means for disabling the feedback.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
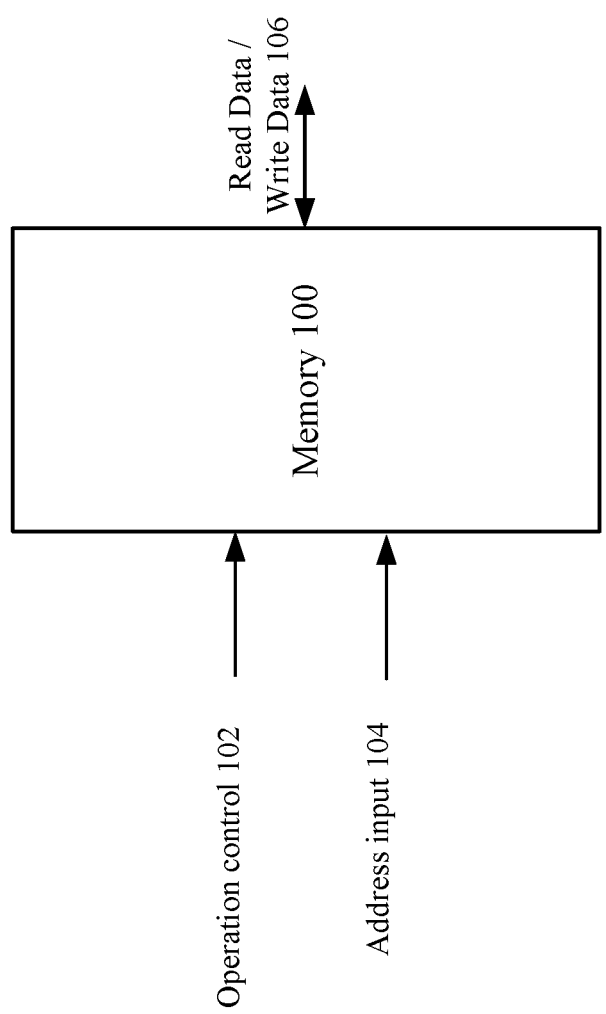
FIG. 1 is a block diagram of an exemplary embodiment of a memory.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, as will be apparent to those skilled in the art, the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various memories and methods for reading from and/or writing to memory presented throughout this disclosure may be incorporated within various apparatuses. By way of example, various aspects of memories disclosed herein may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., smart phone, mobile phone, personal digital assistant (PDA), desktop computer, laptop computer, palm-sized computer, tablet computer, work station, game console, media player, computer based simulators, wireless communication attachments for laptops, or the like). Various aspects of methods disclosed herein shall similarly be implemented in a stand-alone memory or included in any integrated circuit or system, or any portion of an integrated circuit or system, or any intermediate product or end product, or any step, process, algorithm, or the like, or any combination thereof performed by such stand-alone memory, integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory will now be presented in the context of a static random access memory (SRAM) with separate read bitlines and write bitlines. SRAM is volatile memory that requires power to retain data. However, as those skilled in the art will readily appreciate, such aspects may be extended to other memories and/or circuit configurations. Accordingly, all references to the SRAM are intended only to illustrate exemplary aspects of the memory with the understanding that such aspects may be extended to a wide range of applications. In some examples, the described SRAM may be embedded with other integrated circuit (IC) blocks, such as processors, on a substrate. One such example of embedded SRAM is an application processor for wireless communication applications.

FIG. 1 is a block diagram of an exemplary embodiment of a memory. The memory 100 provides a medium for peripheral circuits to write and read data (e.g., program instructions and data operated on by the instructions). As used hereinafter, the term "data" will be understood to include program instructions, data, and any other information that may be stored in the memory 100. The memory 100 includes an input for an operation control 102 for controlling an operation of the memory 100. For example, the memory 100 may operate in read, write, or various test modes. The memory 100 also includes inputs for the address (e.g., via the address input 104) and for write data (e.g., via the read data/write data 106) to be written to the memory 100 at the specified address. The memory further includes an output for read data (e.g., via the read data/write data 106) read from the memory 100 at the specified address. When writing data to the memory 100, a peripheral circuit sets the operation control 102 to the write mode and sends to the memory 100 the address along with the write data to be written to the memory 100 at that address. When reading data from the memory 100, the peripheral circuit sets the read/write enable control to the read mode and sends the address to the memory 100. In response, the memory 100 sends data read at that address to the peripheral circuit.

Figure 2:
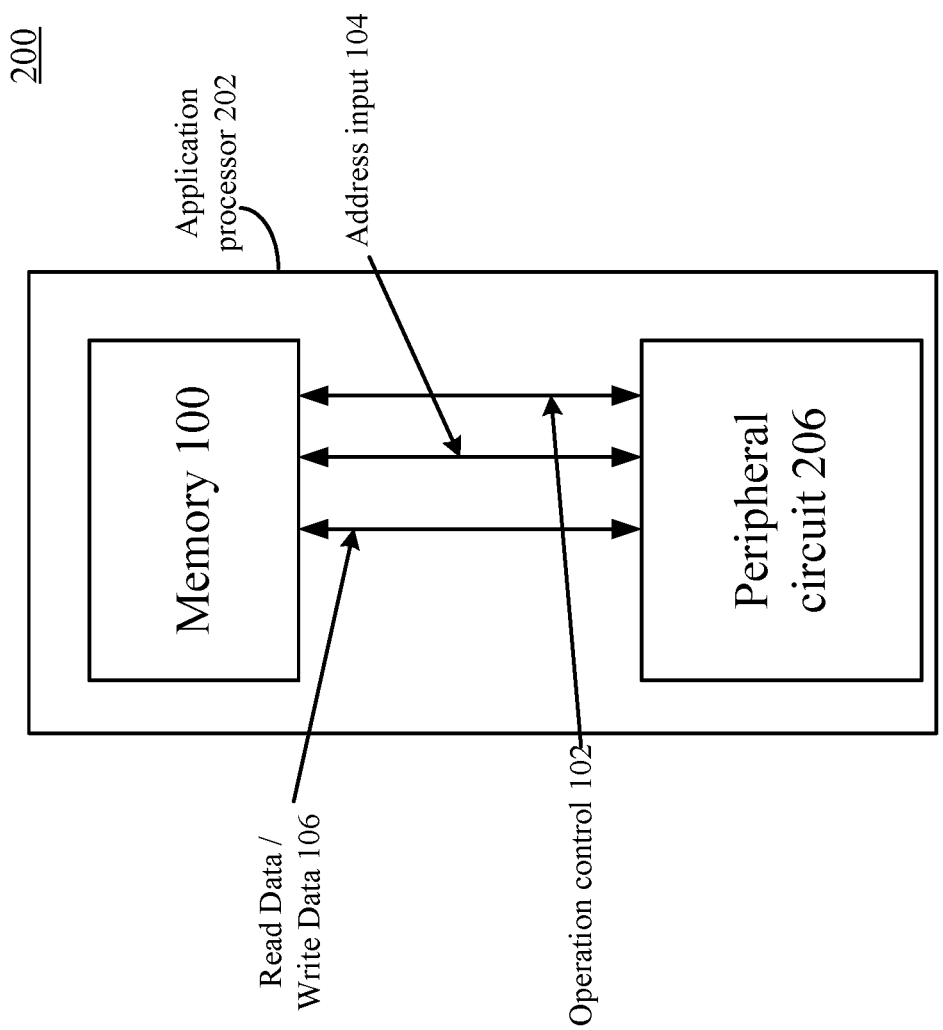
FIG. 2 is a block diagram of an exemplary embodiment of an application processor incorporating the memory of FIG. 1.

FIG. 2 is a block diagram of an exemplary embodiment of an application processor incorporating the memory of FIG. 1. The application processor 202 is provided as an example of an IC substrate having the memory 100 of FIG. 1 incorporated therein. As is known by a person of ordinary skill in the art, applications of the memory 100 are not limited thereto. In some examples, the application processor 202 may be incorporated in the IC substrate upon which the memory 100 and various processor cores are incorporated. A processor core may be a collection of circuits and may include an instruction execution unit. One of the processor cores may operate as or include the peripheral circuit 206. In some examples, the peripheral circuit 206 may be construed broadly to include any suitable circuit that is peripheral to the memory 100 and capable of accessing the memory 100. As described with FIG. 1, the peripheral circuit 206 may instruct the memory 100 to execute a read or write operation via the operation control 102 and the address input 104. The peripheral circuit 206 may further receive the read data from the memory 100 or provide the write data to the memory 100 via the read data/write data 106.

The memory 100 may be any suitable storage medium, such as, by way of example, an SRAM. However, as those skilled in the art will readily appreciate, the memory 100 is not necessarily limited to SRAM. An SRAM includes an array of storage elements known as "cells," "memory cells," or "bitcells." Each memory cell is typically configured to store one bit of data (e.g., logic 1 or logic 0).

Figure 3:
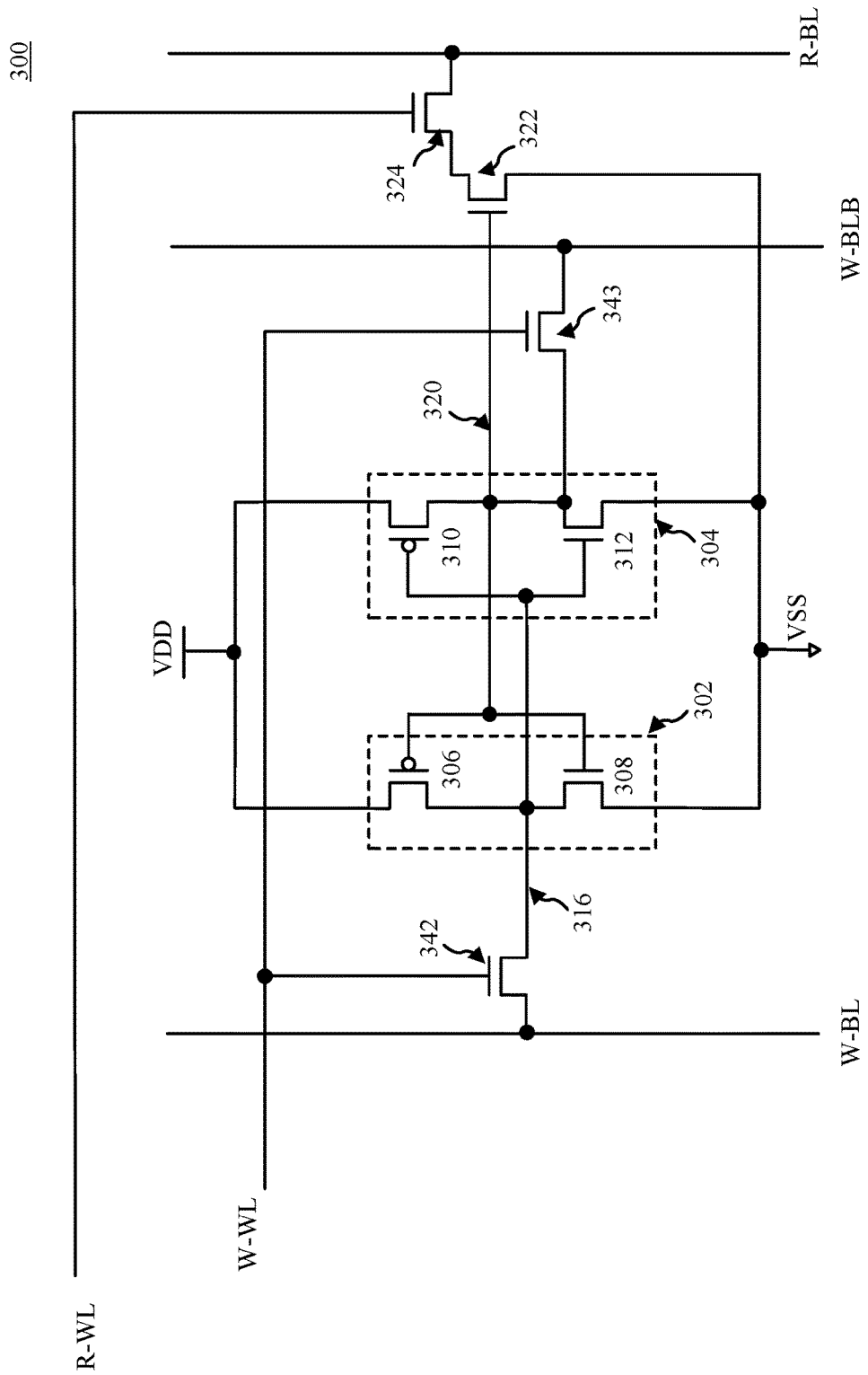
FIG. 3 is a circuit diagram of a memory cell for an SRAM.

FIG. 3 is a circuit diagram of a memory cell for an SRAM. The memory cell 300 includes a pair of cross-coupled inverters 302 and 304 to store data or a logic bit as a pair of complementary bits at nodes 316 and 320. The inverter 302 includes a p-channel transistor 306 and an n-channel transistor 308. The inverter 304 includes a p-channel transistor 310 and an n-channel transistor 312. In the described embodiment, the inverters 302 and 304 are powered by VDD and have a return VSS (e.g., ground). As is known in the art, the return may provide a return path for charges to a power source to complete a circuit. In this disclosure, ground is used as an example for the return.

The inverters 302, 304 are interconnected to form a cross-coupled latch. For example, the node 316 is an input to the inverter 304. The inverter 304, in response, drives the node 320 rail-to-rail. The node 320 is an input to the inverter 302. The inverter 302 drives the node 316 rail-to-rail, and the node 316 feeds back to the inverter 304. In the same fashion, the node 320 feeds back to the inverter 302.

The memory cell 300 includes separate read and write paths. The memory cell 300 includes read access transistors 322 and 324 connected in series. The read access transistors 322 and 324 are n-type transistors and output the stored bit onto the read bitline R-BL by selectively pulling down the read bitline R-BL. The gate of the read access transistor 324 is coupled to the read wordline R-WL. The read access transistor 324 couples (e.g., electrically connects) the read bitline R-BL and the read access transistor 322. The gate of the read access transistor 322 is coupled to the node 320. The read access transistor 322 couples (e.g., electrically connects) the read bitline R-BL and ground via the read access transistor 324, based on the stored bit on the node 320.

The memory cell 300 further includes write access transistors 342 and 343. The write access transistors 342 and 343 are n-type transistors, and the gates of the write access transistors 342 and 343 are coupled to the write wordline W-WL. Write data are carried by the write bitlines W-BL and W-BLB as a complementary signal. The write access transistor 342 couples (e.g., electrically connects) the write bitline W-BL to the node 316 based on the state of the write wordline W-WL. The write access transistor 343 couples (e.g., electrically connects) the write bitline W-BLB to the node 320 based on the state of write wordline W-WL.

A read operation may be initiated by precharging or charging the read bitline R-BL to a predetermined level, such as VDD (The charge circuit is not shown for clarity). The read wordline R-WL then is asserted (e.g., pulled to a high level), turning on the read access transistor 324 and connecting the read access transistor 322 to the read bitline R-BL. In this configuration, the read access transistor 322 may selectively pull down the read bitline R-BL via the read access transistor 324, based on the state of the stored bit on the node 320. By way of example, the memory cell 300 may store the logic 1 by storing a low level (e.g., ground) at the node 316 and a high level (e.g., VDD) at the node 320. The high level at the node 320 turns on the read access transistor 322. These states are maintained by the cross-coupled inverters 302, 304. Upon asserting the read wordline R-WL, the read bitline R-BL is discharged through the read access transistor 324 (turned on by the read wordline R-WL) and the read access transistor 322 (turned on by the node 320). In such fashion, the data stored by the memory cell 300 is output onto the read bitline R-BL. The read bitline R-BL may be fed to a sense amplifier (SA; not shown for clarity), which senses the data (e.g., voltage drop) carried thereon and outputs a logic level (e.g., logic 1) as the read data to the peripheral circuit 206.

A write operation may be initiated by setting the write bitlines W-BL and W-BLB to the value to be written to the memory cell 300 and asserting the write wordline W-WL. That is, the write data are driven onto the write bitlines W-BL and W-BLB. By way of example, a logic 1 may be written to the memory cell 300 by setting the write bitline W-BL to a logic level 0 and the write bitline W-BLB to a logic 1. The logic level 0 at the write bitline W-BL is applied to the input of the inverter 304 (i.e., node 316) through the write access transistor 314, which in turn forces the (output) node 320 of the inverter 304 to VDD. The (output) node 320 of the inverter 304 is applied to the input of the inverter 302, which in turn forces the (output) node 316 of the inverter 302 to VSS. A logic level 0 may be written to the memory cell 300 by inverting the values of the bitlines BL and BLB. The write driver is designed to be stronger than the pull-up transistors (306 and 310) in the memory cell 300 so that the write data can override the previous state of the cross-coupled inverters 302, 304.

Once the read or write operation is complete, the read wordline or write wordline is de-asserted. The cross-coupling between the two inverters 302, 304 maintains the state of the nodes 316 and 320 as long as power is applied to the memory cell 300.

Figure 4:
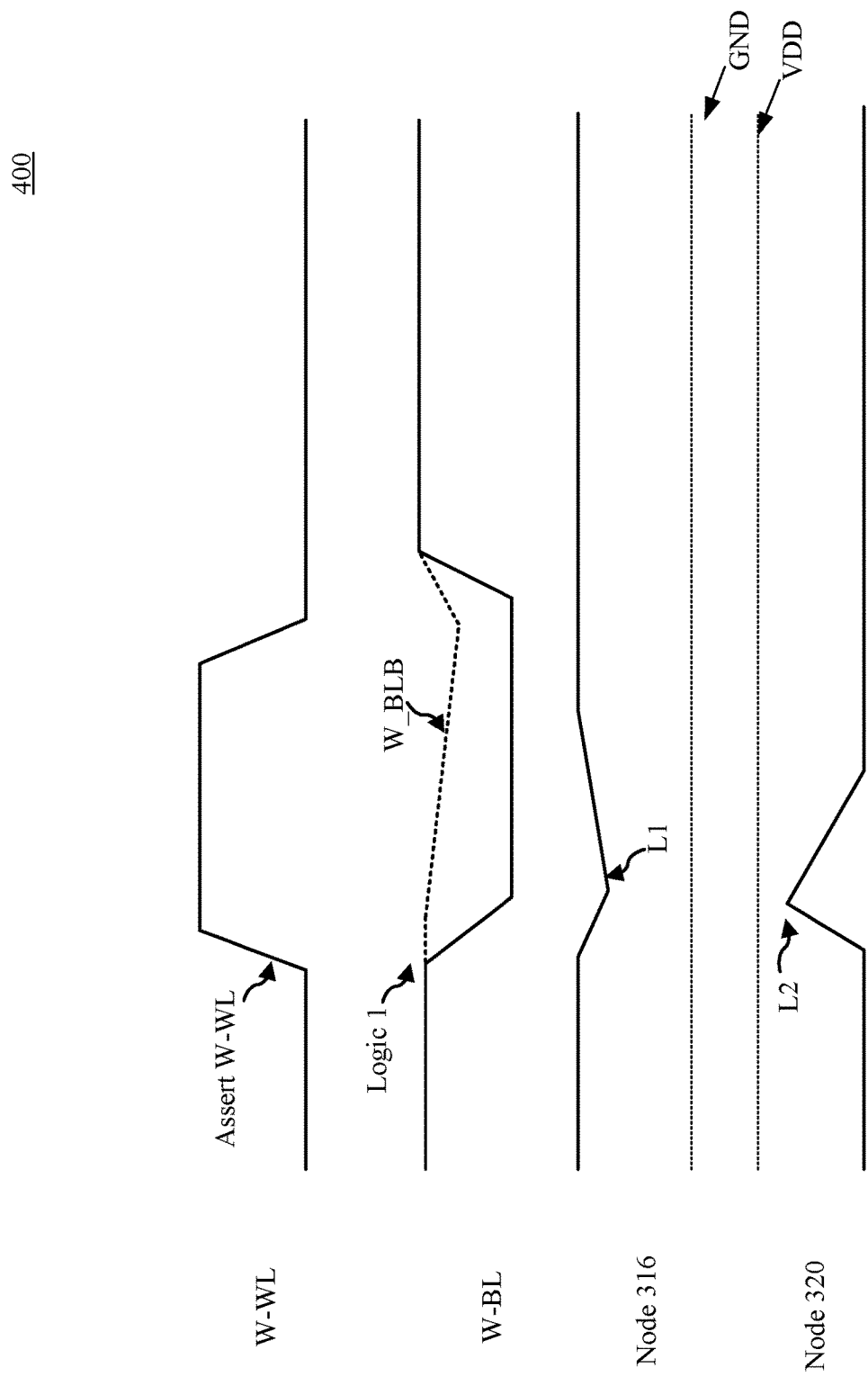
FIG. 4 is a diagram of a write operation of the memory cell of FIG. 3.

As presented above, to write into the memory cell 300, write driver is designed to overcome the output states of pull-up transistors (306 and 310) in the memory cell 300 to override the previous state of the cross-coupled inverters 302, 304. As the operating voltage VDD is lowered, overriding of the previous state during a write operation may be more difficult. FIG. 4 is a diagram of a write operation of the memory cell of FIG. 3. The diagram 400 includes waveforms of the write wordline W-WL, the write bitlines W-BL and W-BLB, and the nodes 316 and 320 of a write operation in which the stored bit is not overwritten. In this example, a logic 0 is stored in the memory cell 300 before the write operation. Thus, a high level is stored at the node 316, and a low level is stored at the node 320.

The write wordline W-WL is asserted, and a logic 1 is written into the write bitlines W-BL and W-BLB. That is, a low level is written into the write bitline W-BL, and a high level is written into the write bitline W-BLB. The node 316 is pulled down to a level L1 by the write bitline W-BL via the write access transistor 342. However, the node 316 is not pulled to ground. In some examples, the node 316 is not pulled to ground because of the low operating voltage of the write wordline W-WL. The low gate voltage of the write wordline W-WL limits the drive current of the write access transistor 342 such that the pull-down of write access transistor 342 on the W-BL cannot overcome the pull-up of the W-BL line by the transistor 306 of the inverter 302. As a result, the node 316 cannot be pulled lower than the level L1. The node 320 is pulled to a level L2 by, for example, the write bitline W-BLB via the write access transistor 343. However, the level L2 is insufficient to flip the stored data of the memory cell 300. As a result, the stored logic 0 of the memory cell 300 is not overridden by the write data (logic 0) on the write bitlines W-BL and W-BLB.

Figure 5:
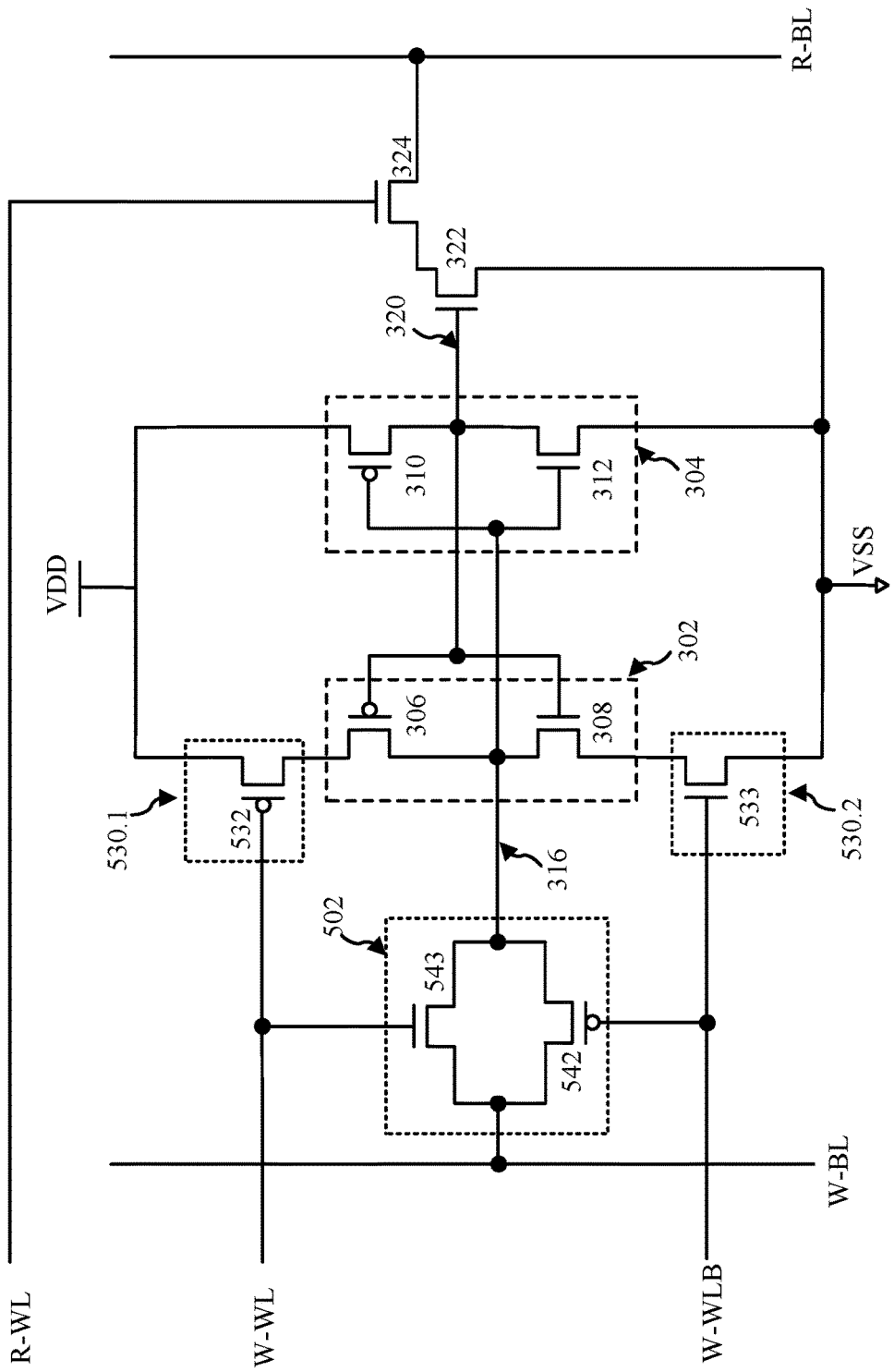
FIG. 5 is a circuit diagram of an exemplary embodiment of a memory cell to improve write margin.

FIG. 5 is a circuit diagram of an exemplary embodiment of a memory cell to improve write margin. The memory cell 500 includes the cross-coupled inverters 302 and 304 to store a bit. The inverter 302 is referenced as the first circuit 302. The memory cell 500 further includes the read access transistors 322 and 324. See, for example, FIG. 3 and the corresponding text for descriptions of the first circuit 302 and the read access transistors 322 and 324. The read operation of the memory cell 500 operates in the same fashion as the memory cell 300, and the details of which have been discussed above with reference to FIG. 3.

The memory cell 500 further includes a second circuit 530 (e.g., portions 530.1 and 530.2) to decouple the stored bit from a power supply (e.g., VDD) and from a return (ground or VSS). The memory cell 500 further includes a pass gate 502 to provide the bit to the memory cell 500 during a write operation, in response to a write wordline signal. The write wordline signal may be a differential signal on the write wordlines W-WL and W-WLB.

In one implementation, the second circuit 530 includes a p-type transistor 532 (e.g., portion 530.1) coupled to the power supply VDD and the transistor 306 of the inverter 302. The power of the inverter 302 is thus supplied by the power supply VDD via the transistor 532. The gate of the transistor 532 is coupled to the write wordline W-WL. The second circuit 530 further includes an n-type transistor 533 (e.g., portion 530.2) coupled to ground and the transistor 308 of the inverter 302. The power of the inverter 302 is thus returned to ground via the transistor 533. The gate of the transistor 533 is coupled to the write wordline W-WLB. In other words, the second circuit 530 includes a first transistor 532 to couple and/or to decouple the inverter 302 to/from the power supply VDD in response to the write wordline signal W-WL. The second circuit 530 includes a second transistor 533 to couple and/or to decouple the inverter 302 to/from the return VSS in response to the write wordline signal W-WLB.

The pass gate 502 includes a p-type transistor 542 and an n-type transistor 543 arranged in parallel. The transistors 542 and 543 may be referred to as pass transistors. The transistor 542 and the transistor 543 couple the write bitline W-BL to the node 316 of the memory cell 500. In general, in some examples, the pass gate 502 may be implemented with a first pass transistor (e.g., transistor 542) of a first type (e.g., p-type) and a second pass transistor (e.g., transistor 543) of a second type (e.g., n-type).

In a write operation, the pass gate 502 provides the bit to be stored (e.g., write data) to the memory cell 500 during the write operation in response to a wordline signal on the write wordlines W-WL and W-WLB. In some examples, the wordline signal is propagated by the write wordlines W-WL and W-WLB as a differential signal. The write operation may be initiated by asserting the write wordlines W-WL (e.g., pulled to a high level) and W-WLB (e.g., pulled to a low level). In response to the assertion of the write wordlines W-WL and W-WLB, the transistor 542 and the transistor 543 are turned on to provide the bit on the write bitline W-BL to the node 316 of the memory cell 500.

In the write operation, the second circuit 530 decouples the inverter 302 from the power supply (e.g., VDD) and from the return (e.g., ground or VSS). With the write wordlines W-WL and W-WLB being asserted, both the first transistor 532 and the second transistor 533 of the second circuit 530 are turned off. In such fashion, the second circuit 530 decouples the bit stored at the node 316 from all power (e.g., power supply VDD) and all returns (e.g., ground or VSS). In another aspect, the first circuit 302 may store a bit by a feedback (e.g., a feedback path/operation). For example, the first circuit 302 (inverter 302) stores the bit at the node 316 by providing a feedback from the node 320. The second circuit 530 can disable that feedback in the write operation. For example, the second circuit 530 isolates the bit stored at the node 316 from all power supplies and returns in the memory cell 500. The first transistor 532 and the second pass transistor 533 are turned off by the assertion of the write wordlines W-WL and W-WLB, respectively, and thereby isolate the inverter 302 (and therefore the bit at the node 316) from the power supply VDD and the conductive layer of the return VSS. In such fashion, the second circuit 530 disables the feedback path of the inverter 302 to store the bit at the node 316 in the write operation. The disabling of the feedback path isolates the node 316 from the power supply and ground of the memory cell 500.

Figure 6:
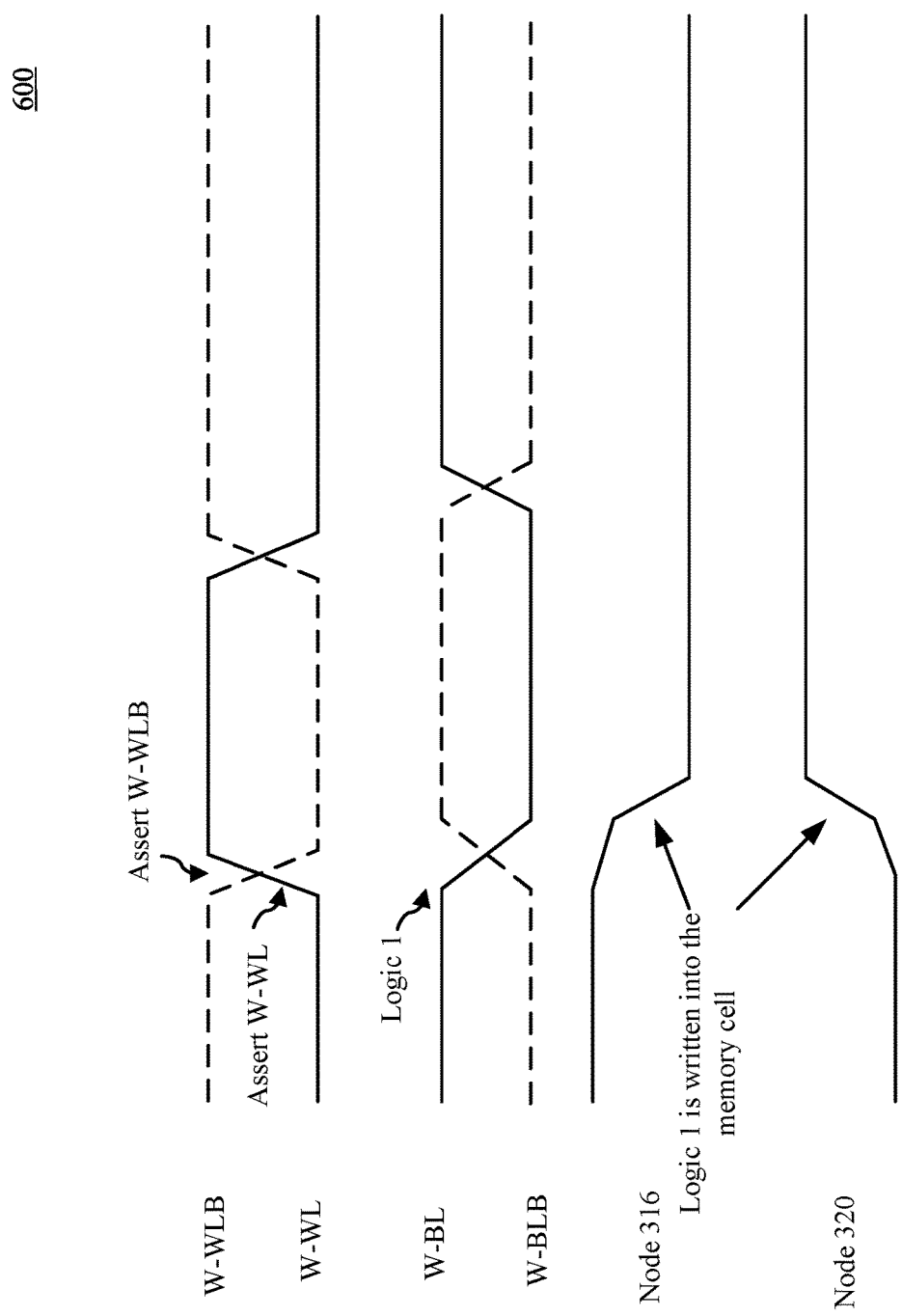
FIG. 6 is a diagram of waveforms of a write operation of the memory cell of FIG. 5.

FIG. 6 is a diagram of waveforms of a write operation of the memory cell of FIG. 5. The diagram 600 includes waveforms of the write wordline W-WL, the write bitlines W-BL and W-BLB, and the nodes 316 and 320 of a write operation in which the stored bit was overwritten. In this example, a logic 0 is stored in the memory cell 500. Thus, a high level is stored at the node 316, and a low level is stored at the node 320.

The write wordline signal is asserted (e.g., the write wordline W-WL is pulled to a high level, and the write wordline W-WLB is pulled to a low level), and a logic 1 (e.g., a low level) is written into the write bitline W-BL. The assertion of the write bitlines W-WL and W-WLB turns on the pass gate 502 to provide the bit on the write bitline W-BL to the node 316.

As illustrated by FIG. 5, the assertion of the write wordline signal turns off both the first transistor 532 and the second transistor 533 of the second circuit 530. In such fashion, the second circuit 530 decouples the bit stored at the node 316 from all power (e.g., power supply VDD) and all returns (e.g., ground or VSS) in the memory cell 500. Thus, the node 316 is pulled down to ground by the write bitline W-BL via the pass gate 502 as the pull-down of the node 316 does not need to overcome the pull-up of the node 316 line by the inverter 302. In other words, the writing of the bit into the memory cell 500 does not need to fight the previously stored data. Moreover, the pass gate 502 may be a complementary pass-gate to allow the bit to be provided to the node 316 rail-to-rail. Thus, in the case the bit is a logic "1" or high level, the pass gate 502 may provide a full VDD level at the node 316. In a case the bit is a logic "0" or low level, the pass gate 502 may provide ground level at the node 316.

In such fashion, writing into the memory cell 500 does not depend, for example, on the voltage level of the write wordlines W-BL and W-BLB, and the write margin of the memory cell 500 is improved over the write margin of the memory cell 300.

Figure 7:
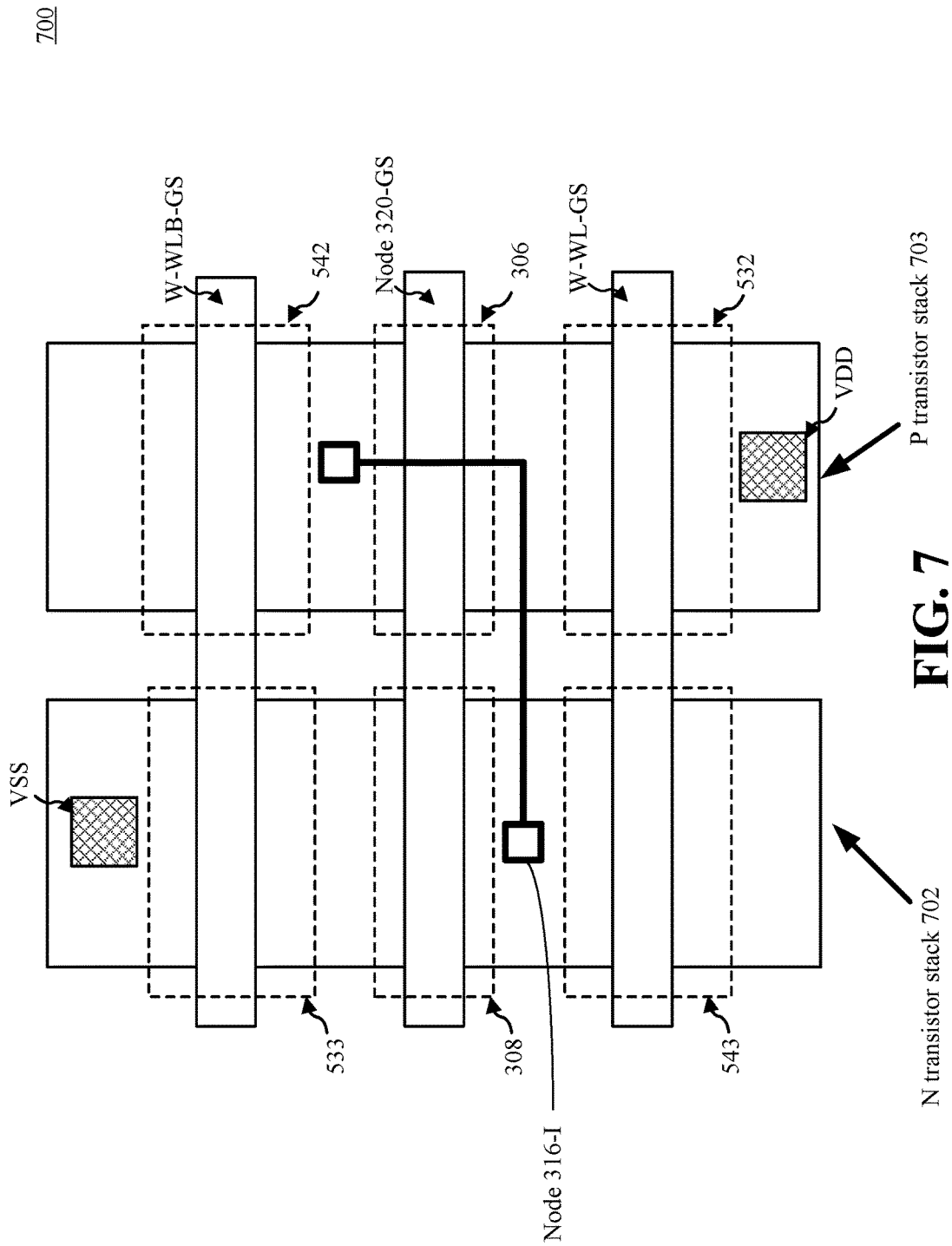
FIG. 7 is a diagram of an exemplary embodiment of a physical implementation of a portion of the memory cell of the FIG. 5.

FIG. 7 is a diagram of an exemplary embodiment of a physical implementation of a portion of the memory cell of the FIG. 5. The diagram 700 includes (physical implementation of) the first circuit 302, the second circuit 530, and the pass gate 502. An N transistor stack 702 includes the n-type transistors, in order, 533 (of the second circuit 530), 308 (of the first circuit 302), and 543 (of the pass gate 502). The P transistor stack 703 includes p-type transistors, in order, 542 (of the pass gate 502), 306 (of the first circuit 302), and 532 (of the second circuit 530).

The transistor 533 of the second circuit 530 and the transistor 542 of the pass gate 502 are aligned to share a straight write bitline W-WLB gate structure, W-WLB-GS. The gate structure W-WLB-GS is a gate layer for the write bitline W-WLB and form the gates of the transistor 533 and the transistor 542. The transistors 308 and 306 (of the first circuit 302) are aligned to share a straight gate structure of the node 320, node 320-GS. The gate structure node 320-GS is a gate layer for the node 320 and form the gates of the transistors 308 and 306 of the first circuit 302. The transistor 543 of the pass gate 502 and the transistor 532 of the second circuit 530 are aligned to share a straight write bitline W-WL gate structure, W-WL-GS. The gate structure W-WL-GS is a gate layer for the write bitline W-WL and form the gates of the transistors 543 and 532. A connection routing (e.g., a metal layer) of the node 316, node 316-I, connects a source/drain (S/D) region of the transistor 306 (shared with the transistor 542) to an S/D region of the transistor 308 (shared with the transistor 543). By way of the transistor alignments and straight gate structures described above, a size of the memory cell 500 may be reduced. For example, each of the straight get structures is continuous and without bends to allow efficient layout of the memory cell.

Figure 8:
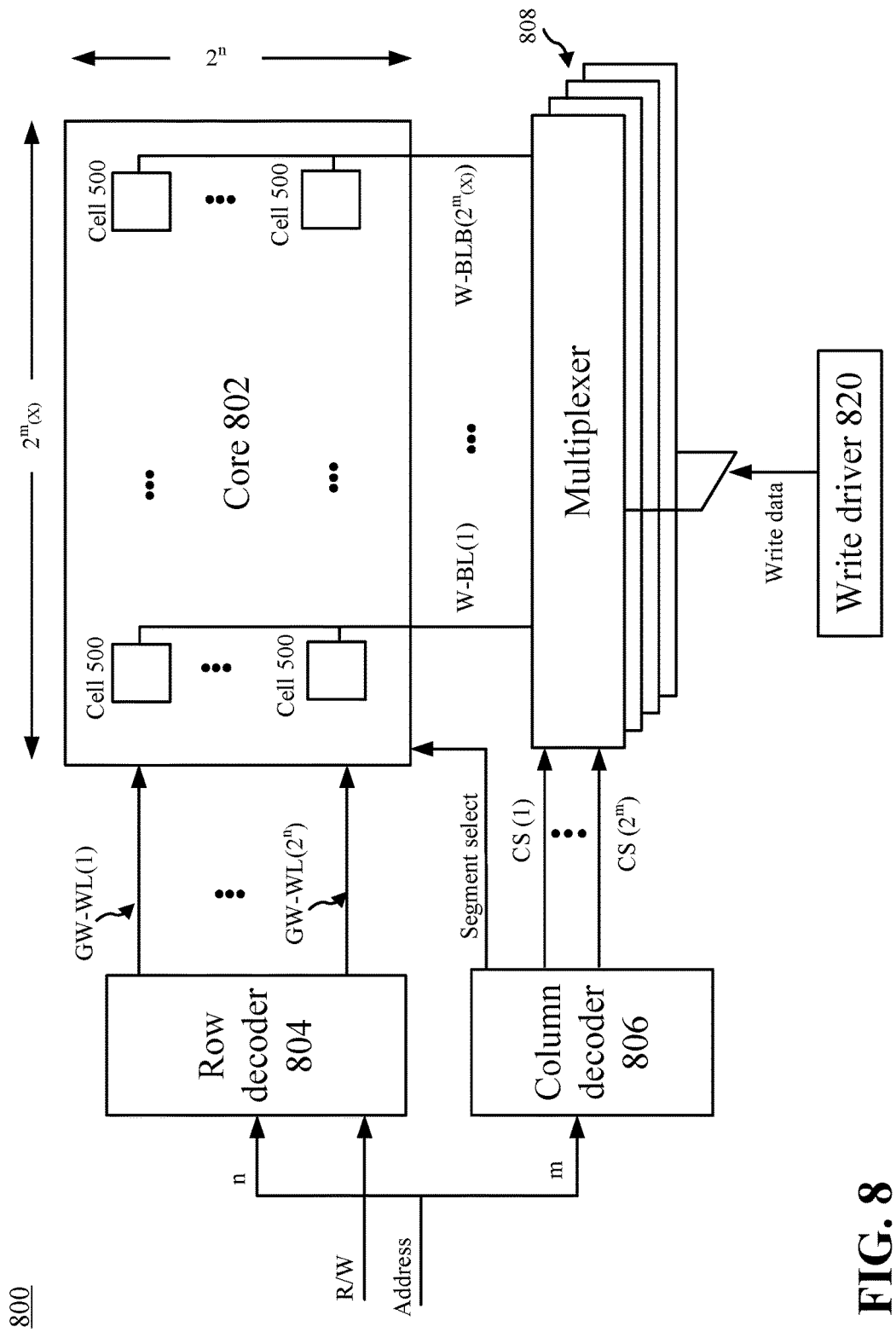
FIG. 8 is a functional block diagram of an exemplary embodiment of an SRAM incorporating the memory cell of FIG. 5.

FIG. 8 is a functional block diagram of an exemplary embodiment of an SRAM incorporating the memory cell of FIG. 5. Various aspects of an SRAM will now be presented in the context of a write operation. Accordingly, for clarity of presentation, only the connections for the write operation are shown. Those skilled in the art will readily appreciate that additional connections may be required to support the read operation.

The SRAM 800 is configured to incorporate and operate (e.g., write) the memory cells 500 to improve write margin. The SRAM 800 includes a core 802 with supporting circuitry to decode addresses and perform read and write operations. The core 802 includes memory cells 500 arranged to share connections in horizontal rows and vertical columns. Specifically, each horizontal row of memory cells 500 shares a global write wordline GW-WL (which will be presented in further details with FIG. 9) and each vertical column of memory cells 500 shares a write bitline W-BL. The size of the core 802 (i.e., the number of cells) may vary depending on a variety of factors including the specific application, the speed requirements, the layout and testing requirements, and the overall design constraints imposed on the system. The core 802 may contain thousands or millions of memory cells.

In the exemplary embodiment of the SRAM shown in FIG. 8, the core 802 is made up of $(2^n \times 2^m(x))$ memory cells 500 arranged in $2^n$ horizontal rows and $2^m(x)$ vertical columns, where $2^m$ is the number of words per row and x is the number of bits per word. A peripheral device (not shown)

may randomly access any word (i.e., x cells) in the core 802 using an address that is (n+m) bits wide. In other words, the SRAM 800 outputs x-bits read data for a read operation, and writes x-bits write data into the core 402 for a write operation.

In this example, n bits of the address are provided to the input of a row decoder 804 and m bits of the address are provided to the input of a column decoder 806. The row decoder 404 converts the n-bit address into $2^n$ wordline outputs, the global write wordlines GW-WL. A different global write wordline GW-WL is asserted by the row decoder 804 for each different n-bit row address. As a result, each of the $2^m(x)$ memory cells 500 in the horizontal row with the asserted global write wordline GW-WL is connected to one of the $2^m(x)$ write bitlines W-BL through its access transistors as described above in connection with FIG. 5. The row decoder 804 may include wordline drivers to assert (e.g., output a high level) onto each of the global write wordlines GW-WL.

The write driver 820 provides the write data (e.g., x bits) to the write bitlines W-BL via the multiplexers 808. The multiplexers 808 are selected by the column selects CS. The column decoder 806 provides $2^m$ column selects CS with a different one of the outputs asserted for each different combination of address inputs. The outputs are provided to x multiplexers 808. Each multiplexer 808 is a $2^m$:1 multiplexer which switches one of x inputs from the write driver 820 between $2^m$ write bitlines W-BL based on the column select CS from the column decoder 806. By way of example, a core that stores 128 4-bit words per row requires four 128:1 multiplexers (e.g., x is four in this example). Each multiplexer input is coupled to one of four outputs from the write driver 820. Based on the decoded m-bit address, each multiplexer 808 couples an input from the write driver 820 to one of four write bitlines W-BL. The four write bitlines W-BL are coupled to four memory cells 500, each storing a corresponding bit in a row.

In parallel, the column decoder 806 decodes a portion of the m address to generate segment select signals. The segment select signals are provided to the core 802 for a wordline segmentation scheme. The scheme is presented in further details with FIG. 9.

Figure 9:
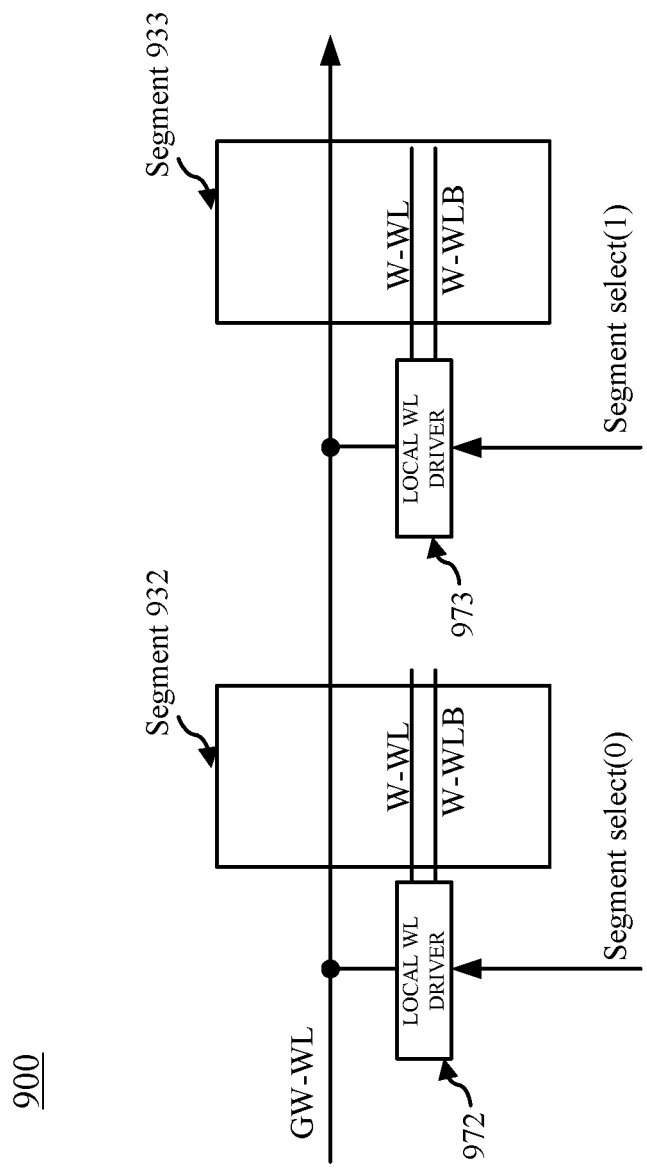
FIG. 9 is a diagram of an exemplary embodiment of wordline segmentation in a core of FIG. 8.

FIG. 9 is a diagram of an exemplary embodiment of wordline segmentation in a core of FIG. 8. The diagram 900 illustrates a single row of the core 802 divided into two segments 932 and 933. Thus, the core 802 includes the memory cells 500 arranged as the segments 932 and 933, where each segment includes memory cells 500 of $2^n$ rows and $2^m(x)/2$ columns. The global write wordline GW-WL is shared by both segments 932 and 933. The global write wordline GW-WL is provided to the local WL driver 972 and the local WL driver 973. Each of the local WL driver 972 and the local WL driver 973 generates the write wordlines W-WL and WL-WB shared by the respective segments 932 and 933. If enabled, the local WL driver 972 and the local WL driver 973 assert the write wordlines W-WL and WL-WB in response to the global write wordline GW-WL being asserted. The local WL driver 972 and the local WL driver 973 are respectively enabled by the segment select(0) and segment select(1) signals outputted by the column decoder 806.

Figure 10:
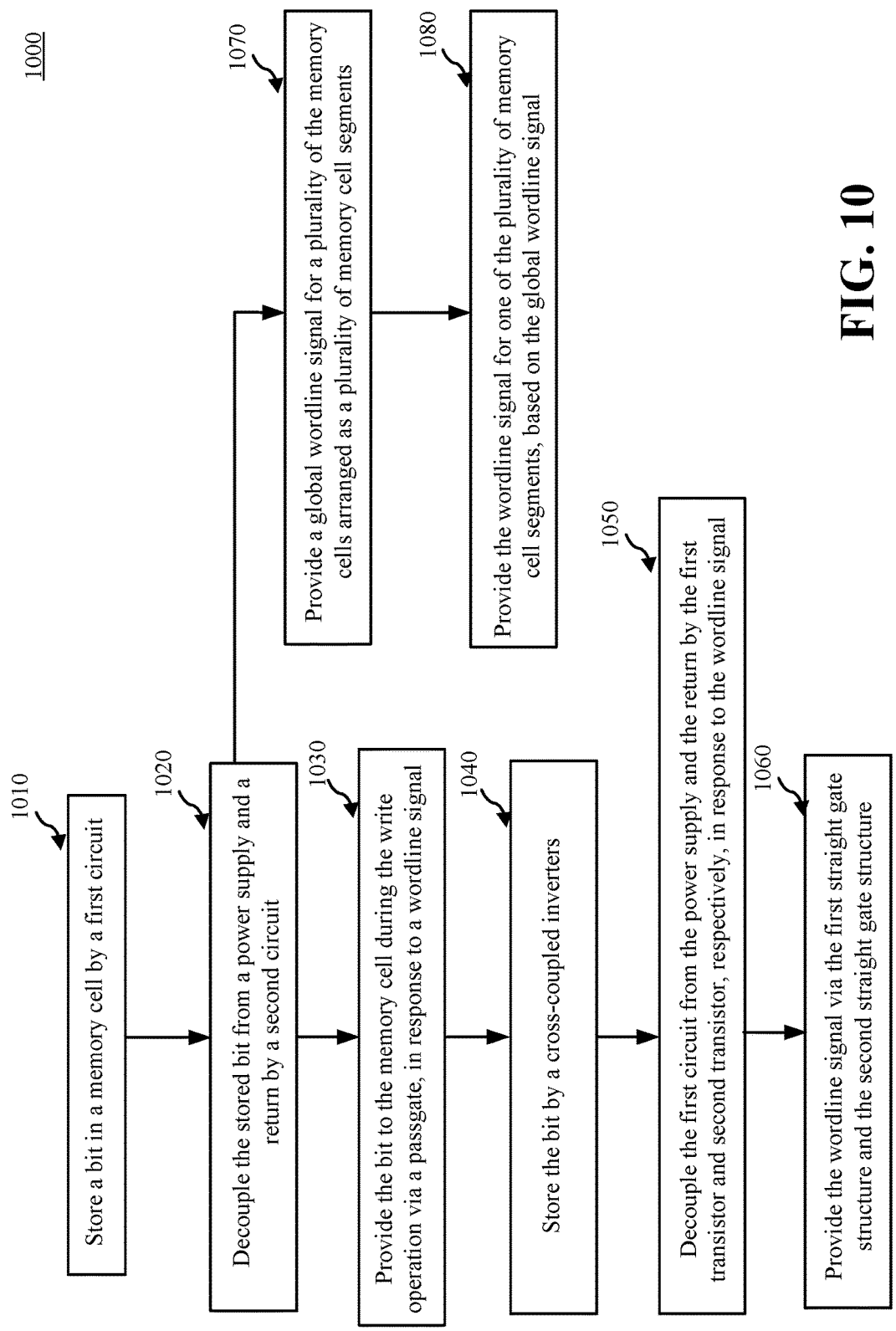
FIG. 10 is the flowchart of operations of the SRAM of FIG. 8

FIG. 10 is the flowchart 1000 of operations of the SRAM of FIG. 8. At 1010, a bit is stored in a memory cell by a first circuit. Referring to FIG. 5, for example, the first circuit (inverter) 302 provides the means to store a bit in the memory cell. A bit may be stored at the node 316 of the memory cell 500 by a first circuit 302. The memory cell 500 includes a cross-coupled inverters 302 and 304 to maintain the stored bit at the node 316.

At 1020, the stored bit is decoupled from a power supply and a return by a second circuit. Referring to FIG. 5, for example, the second circuit 530 serves as the means to decouple the stored bit from a power supply and a return. In a write operation, the second circuit 530 decouples the inverter 302 from the power supply (e.g., a conductive layer of VDD) and from the return (e.g., a conductive layer of ground or VSS) within the memory cell 500. With the write wordlines W-WL and W-WLB being asserted, both the first transistor 532 and the second transistor 533 of the second circuit 530 are turned off. In such fashion, the second circuit 530 decouples the bit stored at the node 316 from all power (e.g., power supply VDD) and all returns (e.g., ground or VSS) in the memory cell 500.

At 1030, the bit is provided to the memory cell during a write operation via a passgate, in response to a wordline signal. Referring to FIG. 5, for example, the pass gate 502 serves as the means to provide the bit to the memory cell 500 in the write operation. The pass gate 502 includes a p-type transistor 542 and an n-type transistor 543 arranged in parallel. The transistor 542 and the transistor 543 couple the write bitline W-BL to the node 316 of the memory cell 300. In other words, in some examples, the pass gate 502 includes a first pass transistor (e.g., transistor 542) of a first type (e.g., p-type) and a second pass transistor (e.g., transistor 543) of a second type (e.g., n-type).

In a write operation, the pass gate 502 provides the bit to be stored (e.g., write data) to the memory cell 500 during the write operation in response to a wordline signal on the write wordlines W-WL and W-WLB. In some examples, the wordline signal is propagated by the write wordlines W-WL and W-WLB as a differential signal. The write operation may be initiated by asserting the write wordlines W-WL (e.g., pulled to a high level) and W-WLB (e.g., pulled to a low level). In response to the assertion of the write wordlines W-WL and W-WLB, the transistor 542 and the transistor 543 are turned on to provide the bit on the write bitline W-BL to the node 316 of the memory cell 500.

At 1040, the bit is stored by a cross-coupled inverters, the cross-coupled inverters comprising the inverter. Referring to FIG. 5, for example, a bit may be stored at the node 316 of the memory cell 500 by a first circuit 302. The memory cell 500 includes a cross-coupled inverters 302 and 304 to maintain the stored bit at the node 316.

At 1050, the first circuit is decoupled from the power supply and the return by a first transistor and a second transistor, respectively, in response to the wordline signal. See, for example, FIG. 5 and the corresponding description. In a write operation, the second circuit 530 decouples the inverter 302 from the power supply (e.g., a conductive layer of VDD) and from the return (e.g., a conductive layer of ground or VSS) within the memory cell 500. With the write wordlines W-WL and W-WLB being asserted, both the first transistor 532 and the second transistor 533 of the second circuit 530 are turned off. In such fashion, the second circuit 530 decouples the bit stored at the node 316 from all power (e.g., power supply VDD) and all returns (e.g., ground or VSS) in the memory cell 500.

At 1060, the wordline signal is provided via the first straight gate structure and the second straight gate structure. See, for example, FIG. 7 and the corresponding description. The transistor 533 of the second circuit 530 and the transistor 542 of the pass gate 502 are aligned to share a straight write bitline W-WLB gate structure, W-WLB-GS. The gate structure W-WLB-GS is a gate layer for the write bitline W-WLB and form the gates of the transistor 533 and the transistor 542. The transistors 308 and 306 (of the first circuit 302) are aligned to share a straight gate structure of the node 320, node 320-GS. The gate structure node 320-GS is a gate layer for the node 320 and form the gates of the transistors 308 and 306 of the first circuit 302. The transistor 543 of the pass gate 502 and the transistor 532 of the second circuit 530 are aligned to share a straight write bitline W-WL gate structure, W-WL-GS. The gate structure W-WL-GS is a gate layer for the write bitline W-WL and form the gates of the transistors 543 and 532.

At 1070, a global wordline signal is provided for a plurality of the memory cells arranged as a plurality of memory cell segments. At 1080, the wordline signal is provided for one of the plurality of memory cell segments, based on the global wordline signal. See, for example, FIG. 9 and the corresponding description. The core 802 includes the memory cells 500 arranged as the segments 932 and 933, each includes memory cells 500 of $2^n$ rows and $2^m(x)/2$ columns. The global write wordline GW-WL is shared by both segments 932 and 933. The global write wordline GW-WL is provided to the local WL driver 972 and the local WL driver 973. Each of the local WL driver 972 and the local WL driver 973 generates the write wordlines W-WL and WL-WB shared by the respective segments 932 and 933. In enabled, the local WL driver 972 and the local WL driver 973 assert the write wordlines W-WL and WL-WB in response to the global write wordline GW-WL being asserted. The local WL driver 972 and the local WL driver 973 are respectively enabled by the segment select(0) and segment select(1) signals outputted by the column decoder 806.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A memory, comprising
  a memory cell comprising
    a first circuit configured to store a bit;
    a second circuit configured to decouple the first circuit from a power supply and from a return, in response to a wordline signal during a write operation; and
    a pass gate configured to provide the stored bit to the memory cell in response to the wordline signal during the write operation; and
  a plurality of the memory cell arranged as a plurality of memory cell segments, wherein the wordline signal is shared by one of the plurality of memory cell segments, and is based on a global wordline signal provided for the plurality of memory cell segments.

2. The memory of claim 1, wherein the first circuit comprises an inverter.

3. The memory of claim 2, wherein the memory cell comprises a pair of cross-coupled inverters, the pair of cross-coupled inverters comprising the inverter.

4. The memory of claim 1, wherein the second circuit comprises a first transistor configured to decouple the first circuit from the power supply and a second transistor configured to decouple the first circuit from the return.

5. The memory of claim 4, wherein the first transistor and the second transistor are further configured to decouple the first circuit from the power supply and the return, respectively, in response to the wordline signal, wherein the wordline signal comprises a differential signal.

6. The memory of claim 5,
  wherein the pass gate comprises a first pass transistor and a second pass transistor, and the first transistor and the second transistor share a first straight gate structure.

7. The memory of claim 6,
  wherein the second transistor and the first pass transistor share a second straight gate structure.

8. The memory of claim 7, wherein the first transistor and the first pass transistor comprise transistors of a first type, and the second transistor and the second pass transistor comprise transistor of a second type.

9. The memory of claim 7, wherein the first straight gate structure and the second straight gate structure are configured to provide the wordline signal.

10. A method of operating a memory, comprising
  storing a bit in a memory cell by a first circuit;
  decoupling the first circuit from a power supply and a return by a second circuit, in response to a wordline signal during a write operation;
  providing the stored bit to the memory cell via a pass gate, in response to the wordline signal during the write operation;
  providing a global wordline signal for a plurality of the memory cells arranged as a plurality of memory cell segments; and
  providing the wordline signal for one of the plurality of memory cell segments, based on the global wordline signal.

11. The method of claim 10, wherein the first circuit comprises an inverter.

12. The method of claim 11, further comprises storing the bit by a pair of cross-coupled inverters, the pair of cross-coupled inverters comprising the inverter.

13. The method of claim 10, wherein the second circuit comprises a first transistor to decouple the first circuit from the power supply and a second transistor to decouple the first circuit from the return.

14. The method of claim 13, further comprising decoupling the first circuit from the power supply and the return by the first transistor and the second transistor, respectively, in response to the wordline signal, wherein the wordline signal comprises a differential signal.

15. The method of claim 14,
wherein the pass gate comprises a first pass transistor and a second pass transistor, and the first transistor and the second transistor share a first straight gate structure.

16. The method of claim 15, wherein the second transistor and the first pass transistor share a second straight gate structure.

17. The method of claim 16, wherein the first transistor and the first pass transistor comprise transistors of a first type, and the second transistor and the second pass transistor comprise transistor of a second type.

18. The method of claim 17, further comprising providing the wordline signal via the first straight gate structure and the second straight gate structure.

19. A memory, comprising:
a memory cell comprising
means for storing a bit by a feedback;
means for disabling the feedback in response to a wordline signal during a write operation; and
means for providing the stored bit to the memory cell in response to the wordline signal during the write operation; and
a plurality of the memory cell arranged as a plurality of memory cell segments, wherein the wordline signal is shared by one of the plurality of memory cell segments, and is based on a global wordline signal provided for the plurality of memory cell segments.

20. The memory of claim 19, wherein the means for disabling the feedback isolates the bit from power and ground in the memory cell.

\* \* \* \* \*